(12) United States Patent
Bhandari et al.

(10) Patent No.: US 12,439,674 B2
(45) Date of Patent: Oct. 7, 2025

(54) SEMICONDUCTOR POWER DEVICE AND METHOD OF MANUFACTURING THE SAME

(71) Applicant: Infineon Technologies Austria AG, Villach (AT)

(72) Inventors: Jyotshna Bhandari, Villach (AT); Gerald Patterer, Kirchbach (AT); Maximilian Roesch, St. Magdalen (AT); Werner Schustereder, Villach (AT); Stanislav Vitanov, Villach (AT)

(73) Assignee: Infineon Technologies Austria AG, Villach (AT)

( * ) Notice: Subject to any disclaimer, the term of this patent is extended or adjusted under 35 U.S.C. 154(b) by 861 days.

(21) Appl. No.: 17/592,543

(22) Filed: Feb. 4, 2022

(65) Prior Publication Data
US 2022/0254892 A1 Aug. 11, 2022

(30) Foreign Application Priority Data

Feb. 9, 2021 (EP) ..................................... 21155948

(51) Int. Cl.
*H10D 64/01* (2025.01)
*H10D 64/27* (2025.01)
(Continued)

(52) U.S. Cl.
CPC ........... *H10D 64/513* (2025.01); *H10D 64/01* (2025.01); *H10D 64/667* (2025.01); *H10D 84/83* (2025.01); *H10D 64/117* (2025.01)

(58) Field of Classification Search
CPC .... H10D 64/513; H10D 64/01; H10D 64/667; H10D 84/83; H10D 64/117; H10D 30/0297; H10D 30/668; H10D 34/256
(Continued)

(56) References Cited

U.S. PATENT DOCUMENTS

| 10,243,051 B2 | 3/2019 | Feil |
| 2010/0006928 A1 | 1/2010 | Pan et al. |

(Continued)

FOREIGN PATENT DOCUMENTS

EP 3657548 A1 5/2020

OTHER PUBLICATIONS

Lu, Qiang, et al., "Metal Gate Work Function Adjustment for Future CMOS Technology", IEEE Xplore; 2001 Symposium on VLSI Technology Digest of Technical Papers, 2001, pp. 45-46.
(Continued)

*Primary Examiner* — Wael M Fahmy
*Assistant Examiner* — Fernando Jose Ramos-Diaz
(74) *Attorney, Agent, or Firm* — Murphy, Bilak & Homiller, PLLC (57) ABSTRACT

The application relates to a semiconductor power device including a semiconductor body in which a transistor device is formed, the transistor device having a gate region and a channel region laterally aside the gate region, the gate region including a gate electrode for controlling a channel formation in the channel region, and a gate dielectric laterally between the channel region and the gate electrode. The gate electrode includes a gate electrode bulk region and a gate electrode layer laterally between the gate dielectric and the gate electrode bulk region. The gate electrode layer is made of a doped metallically conductive material.

12 Claims, 13 Drawing Sheets

(51) Int. Cl.
  *H10D 64/66* (2025.01)
  *H10D 84/83* (2025.01)
  *H10D 64/00* (2025.01)

(58) Field of Classification Search
  USPC .......................................................... 257/334
  See application file for complete search history.

(56) References Cited

U.S. PATENT DOCUMENTS

| | | |
|---|---|---|
| 2015/0349073 A1 | 12/2015 | Kang |
| 2016/0043000 A1* | 2/2016 | Rieger ................. H10D 62/393 |
| | | 257/334 |
| 2016/0172488 A1* | 6/2016 | Oh ....................... H10D 64/513 |
| | | 257/330 |
| 2019/0259839 A1* | 8/2019 | Ryu ...................... H01L 21/324 |
| 2020/0168719 A1 | 5/2020 | Liu et al. |
| 2020/0203525 A1 | 6/2020 | Haase et al. |

OTHER PUBLICATIONS

Xu, Qiuxia, et al., "Ion-Implanted TiN Metal Gate With Dual Band-Edge Work Function and Excellent Reliability for Advanced CMOS Device Applications", IEEE Transactions on Electron Devices, vol. 62, No. 12, Dec. 2015, pp. 4199-4205.

\* cited by examiner

SEMICONDUCTOR POWER DEVICE AND METHOD OF MANUFACTURING THE SAME

TECHNICAL FIELD

The present disclosure relates to a semiconductor power device with a semiconductor body in which a transistor device is formed.

BACKGROUND

The transistor device disclosed here comprises a channel region and a gate electrode formed laterally aside, e. g. in a vertical gate trench. The gate electrode capacitively couples to the channel region via a gate dielectric arranged laterally in between. By applying a voltage to the gate electrode, a channel path formation in the channel region can be controlled.

SUMMARY

It is an object of the present disclosure to provide a power device with improved characteristics, as well as a method of manufacturing such a device.

The gate electrode of this device comprises a gate electrode bulk region and a gate electrode layer, which is arranged laterally between the gate dielectric and the gate electrode bulk region. The gate electrode layer is made of a doped metallically conductive material, which can for instance allow for a work function adaption.

The work function achieved with the doped metallically conductive material can for example be lower compared to a pure metal gate. A higher work function could vice versa require a lower body doping to meet a target threshold voltage, resulting for instance in a higher lateral body resistance and an earlier switching of a parasitic bipolar. The gate electrode layer can allow for a reduction of an overall resistivity of the gate electrode while an excessive change of the band structure can be avoided. The reduced resistance can allow for a shrink of the transistor device and/or an increased switching speed.

Particular embodiments and features are provided throughout this disclosure. Therein, the individual features shall be disclosed independently, the disclosure relates to apparatus and device aspects, but also to method and use aspects. If for instance a device manufactured in a specific way is described, this is also a disclosure of a respective manufacturing process, and vice versa.

In general words, an approach of this application is to form a gate electrode comprising a gate electrode layer aside the channel region, e. g. adjacent the gate dielectric, and a gate electrode bulk region. Choosing or adapting the materials of the gate electrode layer and the bulk region can allow for an optimization of both, the work function and the gate resistivity.

The "gate electrode" is the electrically conductive part of the gate region. Seen in a vertical cross-section, the gate electrode layer can for instance form the whole side wall of the gate electrode, e. g. extend from an upper end to a lower end of the gate electrode. In particular, the gate electrode layer can form an outer side wall of the gate electrode, lying directly adjacent to the gate dielectric. Depending on the embodiment in detail, an additional layer of the same material can be arranged at the bottom of the gate electrode and/or at a laterally opposite side wall of the gate electrode. At the latter side wall, a further transistor device can be formed, e. g. symmetrically to the first transistor device.

Referring to a source and a drain region of a first conductivity type, the channel region can be formed in a body region of a second conductivity type opposite to the first conductivity type. In particular, the source region can be formed at a frontside of the device and the drain region at a backside thereof, the channel region arranged vertically between. As a power device, the transistor can additionally comprise a drift region formed between the body/channel region and the drain region. The drift region is of the first conductivity type as well, wherein its dopant concentration is lower compared to the drain region. As a power device, the transistor can for instance have a breakdown voltage of at least 10 V, 20 V, 30 V, 40 V or 50 V, possible upper limits being for example not more than 800 V, 600 V, 400 V or 200 V.

The gate electrode layer can for instance have a lateral thickness of at least 5 nm or 10 nm, possible upper limits being for instance 50 nm, 40 nm, 30 nm or 20 nm. Referring to the cross-sectional area of the gate electrode as a whole, the gate electrode bulk region can for example have a share of at least 60%, 70% or 80% (possible upper limits are for instance 99% or 95%). The "metallically conductive material" of the gate electrode layer can for instance have an electrical resistivity of not more than 5 $\Omega mm^2/m$, 3 $\Omega mm^2/m$, 2 SI $mm^2/m$, 1 $\Omega mm^2/m$ or 0.5 $\Omega mm^2/m$. Possible lower limits, that shall be disclosed independently of the upper limits, can for example be 0.01 $\Omega mm^2/m$ or 0.03 $\Omega mm^2/m$. Both, the lower and the upper limits refer to the undoped state of the metallically conductive material. The use of a metallically conductive material can for instance reduce an overall resistivity, while a work function adaption can be achieved by the doping, preventing for example an excessive change of the band structure.

The gate electrode can be formed in a vertical gate trench, which extends vertically into the semiconductor body. The "vertical direction" lies perpendicular to a surface of the device, e. g. a front surface of the semiconductor body; the "lateral" directions lie perpendicular to the vertical direction. Laterally, the gate trench can have a longitudinal extension; together, a plurality gate trenches can form a grid, e. g. with a needle-shaped field electrode formed in each cell of the grid. In particular, a field electrode can be formed in the gate trench, vertically below the gate electrode and electrically isolated therefrom, e. g. by an oxide layer. Seen in a top view, this gate trench with the field electrode can have a strip-like shape, e. g. with a straight extension. Across the device, a plurality of these trenches can be arranged as parallel stripes.

In an embodiment, the metallically conductive material of the gate electrode layer is titanium nitride (TiN). Generally, possible alternatives can be titanium (Ti), titanium tungsten (TiW), tungsten (W) or cobalt (Co). Independently of the specific gate electrode layer material, the gate electrode can, in general, comprise an additional gate electrode layer laterally between the gate electrode layer and the gate electrode bulk region, the additional layer made for example of another metallically conductive material. The gate electrode layer can for instance be used to adjust the work function and the resistivity, and the additional layer for an additional tuning of the combined layers resistivity. In particular, however, the gate electrode bulk region can be formed directly adjacent to the gate electrode layer.

In an embodiment, the gate electrode layer is doped with a doping agent comprising fluorine (F) and/or nitrogen (N) and/or carbon (C) and/or aluminum (Al). Alternatively or in addition, the doping agent can comprise oxygen (O) and/or hydrogen (H). In a particular embodiment, the gate electrode layer can be doped with nitrogen and/or fluorine, in particular when the body region, which comprises the channel region, is p-doped.

In an embodiment, the gate electrode bulk region is made of polysilicon, in particular doped polysilicon. The combination of a gate electrode bulk region made of polysilicon, in particular doped polysilicon, and a gate electrode layer made of a metallically conductive material, in particular titanium nitride (see also the definition above and the alternatives), is also to be disclosed independently of a doping of the gate electrode layer. In other words, in this embodiment, the gate electrode layer, in particular titanium nitride gate electrode layer, is not necessarily doped. Regarding other particular details of the gate electrode bulk region and gate electrode layer, e. g. regarding geometrical details, reference is made to the disclosure relating to the doped gate electrode layer.

In an alternative embodiment, the gate electrode bulk region is made of a metal material, e. g. tungsten. The metal material gate electrode bulk region can for instance have a work function which is about 400 mV-500 mV higher compared to polysilicon. However, the doping of the gate electrode layer can allow for an adaption of the work function, enabling nevertheless the use of the metal. The metal can for instance have a comparably low electrical resistivity, allowing for a shrink and/or an increased switching speed.

In an embodiment, an upper end of the gate electrode layer is arranged recessed with respect to a frontside of the semiconductor body, e. g. by at least 20 nm, 30 nm or 40 nm (in the vertical direction). Possible upper limits can for instance be 200 nm, 150 nm or 100 nm. In particular, the gate electrode as a whole can be respectively recessed, reducing for instance the source-gate capacitance. Generally, the "semiconductor body" can comprise the semiconductor substrate and, if applicable, one or more epitaxial layer or layers formed on the semiconductor substrate. In the epitaxial layer(s), the source and the body region can be formed. On the semiconductor body an insulating layer can be formed, a frontside metallization formed on the insulating layer, e. g. a source metallization.

In an embodiment, the power device comprises a MOS-gated diode (MGD) in addition to the transistor device. An MGD gate region of the MGD diode comprises an MGD interlayer dielectric and an MGD gate electrode, wherein the MGD interlayer dielectric can be thinner than the gate dielectric of the transistor device. The MGD gate electrode comprises an MGD gate electrode bulk region which can in particular be formed directly adjacent to the MGD interlayer dielectric. In other words, no MGD gate electrode layer is formed in between the MGD gate electrode bulk region and the MGD interlayer dielectric, in particular no metal layer. The MGD gate electrode can be solely made of the MGD gate electrode bulk material, namely consist of the latter.

Like the gate electrode of the transistor device, the MGD gate electrode can be formed in a vertical trench. The MGD channel region can be arranged laterally aside the MGD gate region, e. g. extend vertically along the MGD gate trench. The MGD interlayer dielectric can be thinner than the gate dielectric, taken in the lateral direction, for instance have a thickness of a few nanometers (e. g. not more than 10 nm). In an embodiment, the gate electrode bulk region of the transistor device and the MGD gate electrode bulk region are made of the same material. This gate electrode bulk material can in particular be polysilicon, e. g. doped polysilicon. Generally, a field electrode can be formed in the MGD gate trench, vertically below the MGD gate electrode and electrically isolated therefrom.

In an embodiment, the power device comprises an additional transistor device which has a gate region with a gate electrode and a gate dielectric. The gate electrode of the additional transistor device can comprise or consist of a gate electrode bulk region and a gate electrode layer, the latter formed laterally between the gate dielectric of the additional transistor device and its gate electrode bulk region. In particular, the gate electrode layers of the transistor device discussed so far and of the additional transistor device can have different material properties. The "different material properties" can for instance be different metallically conductive materials (e. g. titanium versus titanium nitride) and/or different doping agents (or different doping agent position/density). This can enhance the possibilities for an adaption, e. g. across the device.

In an embodiment, the power device comprises an additional transistor device with a gate region having a gate electrode and a gate dielectric. In contrast to the transistor device or devices discussed so far, a gate electrode bulk region of this additional transistor device can be formed directly adjacent to the gate dielectric. In particular, the gate electrode of the additional transistor device can consist solely of the gate electrode bulk region. As discussed above, the bulk region material can for instance be (doped) polysilicon or metal, e. g. tungsten.

To summarize, the transistor devices formed in the semiconductor substrate can have gate electrode layers with different material properties and/or some can be formed without a gate electrode layer at all. With this variation, for instance, different switching properties can be adjusted across the device, the switching behavior can for example differ at the edge of the device and in the center (e. g. to counteract hotspot formation). As discussed so far, this variation concerns different transistor devices formed in the same semiconductor body, e. g. in the same die.

Alternatively or in addition, the transistor devices formed in different power devices can have different properties, namely the transistor devices formed in different dies. Therein, each device comprises a transistor device with a gate electrode having a gate electrode bulk region and a gate electrode layer. In particular, the gate electrode bulk regions of the different semiconductor power devices can be formed of the same gate electrode bulk material, e. g. (doped) polysilicon or metal. Moreover, the gate electrode bulk regions of the different devices, or even their gate electrodes as a whole, can for instance be identical regarding their geometrical properties, e. g. lateral width and vertical depth.

However, despite of the same electrode bulk material used for the gate electrode bulk regions of the different devices, their gate electrode layers can differ in a doping agent and/or doping agent position and/or doping agent density. In one device of the set, the gate electrode layer can for instance be p-type doped, whereas it is n-doped in another device of the set. Regarding possible doping agents, reference is made to the description above, wherein the different doping agents differ in at least one dopant. A different doping agent position can for instance be achieved by different implant energies, and different densities can be achieved by a variation of the implant dose.

The method for manufacturing a power device disclosed here comprises:
 i) forming the gate dielectric of the gate region of the transistor device;
 ii) forming the gate electrode layer of the doped metallically conductive material;

iii) forming the gate electrode bulk region of a gate electrode bulk material.

The gate electrode layer can be formed by depositing the metallically conductive material, e. g. combined with a subsequent doping and/or an in-situ doping.

In an embodiment relating to the manufacturing of a device comprising additionally an MGD diode, a sidewall of the MGD interlayer dielectric, which sidewall lies laterally opposite to the MGD channel region, is covered during the formation of the gate electrode layer. Generally, the electrically conductive material deposited for forming the gate electrode layer could also be deposited onto said sidewall of the MGD interlayer dielectric and removed afterwards, or the MGD interlayer dielectric could even be formed after the formation of the gate electrode layer. However, covering and protecting said sidewall can allow for a certain process integration.

In general, the sidewall can be protected by a dummy or a spacer removed after the formation of the gate electrode layer. However, in particular, the MGD gate electrode can be formed prior to step ii), the sidewall of the MGD interlayer dielectric being in consequence covered by the MGD gate electrode.

In an embodiment, a layer of the metallically conductive material is formed on the MGD gate electrode, which has been formed before, simultaneously during the formation or deposition in step ii). This metallically conductive material can cover and protect the MGD gate electrode during a recess etch of the gate electrode bulk material. Likewise, e. g. a recessed gate electrode can be formed (see above), while the layer of metallically conductive material is re-used as a hard mask.

Before, when the gate dielectric of the transistor device is for instance formed by oxidation, an oxide layer can simultaneously be formed at the top of the MGD gate electrode, e. g. polysilicon oxide. In this case, this oxide layer will be arranged below the layer of the metallically conductive material, e. g. between the latter layer and the MGD gate electrode bulk region. After the recess etch in the gate trench of the transistor device, the layer of the metallically conductive material and, if present, the oxide layer can be removed.

BRIEF DESCRIPTION OF THE DRAWINGS

Below, the power device and the manufacturing of the same are explained in further detail by means of exemplary embodiments. Therein, the individual features can also be relevant in a different combination.

DETAILED DESCRIPTION

Figure 1:
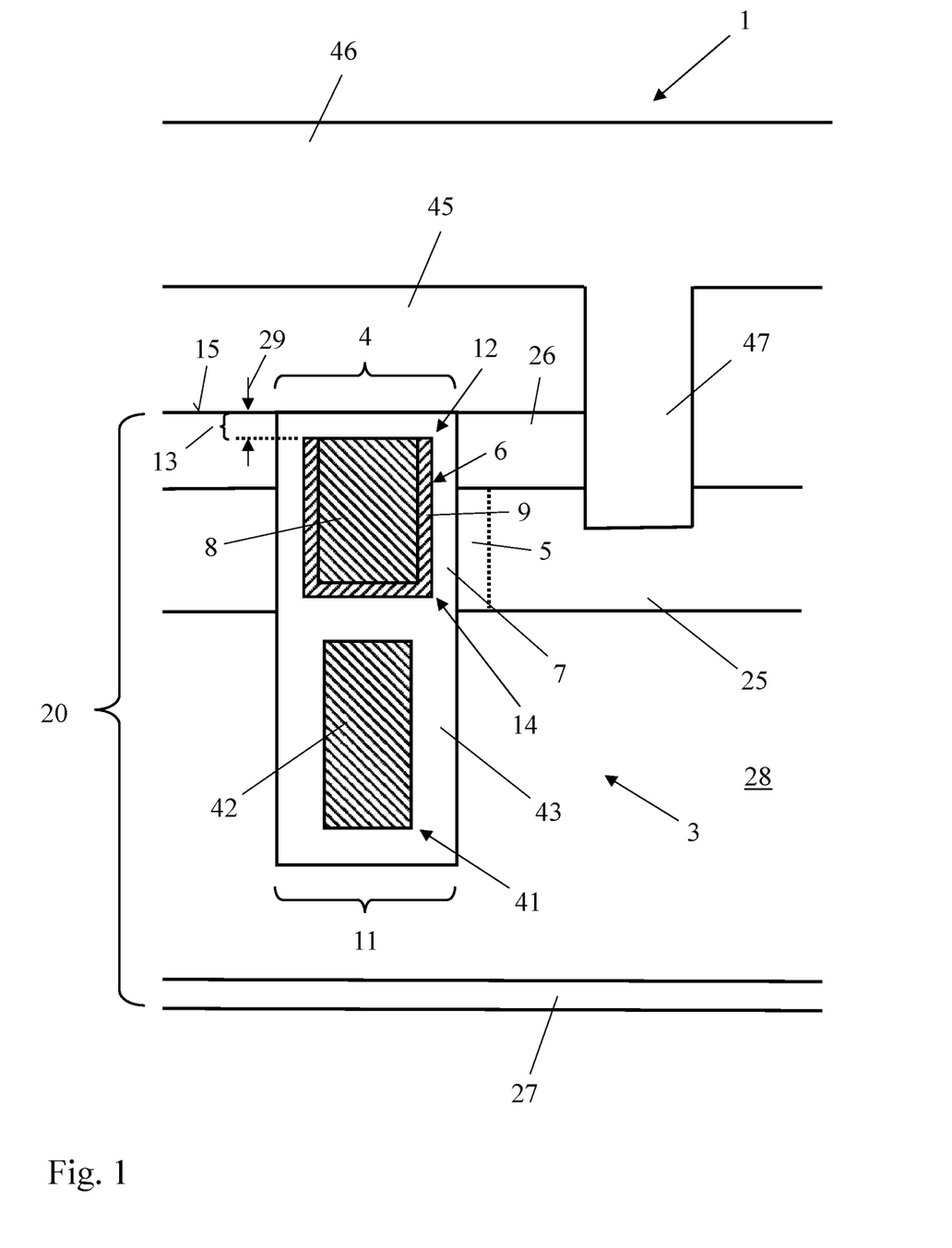
FIG. 1 shows a power device having a transistor device formed in a semiconductor body.

FIG. 1 shows a power device 1 with a semiconductor body 20 in which a transistor device 3 is formed. The transistor device 3 comprises a gate region 4 having a gate electrode 6 and a gate dielectric 7. The latter capacitively couples the gate electrode 6 to a channel region 5 arranged laterally aside. The channel region 5 is formed in a body region 25, which is p-doped in this exemplary embodiment. The body region 25 is formed below an n-doped source region 26, and a drain region 27 is formed at the backside of the semiconductor body 20. Vertically between the body region 25 and the drain region 27, a drift region 28 is formed. The latter is n-doped like the drain region 27, but with a lower doping concentration.

The gate electrode 6 comprises a central gate electrode bulk region 8 and a gate electrode layer 9, which is arranged laterally between the gate dielectric 7 and the gate electrode bulk region 8. The gate electrode layer 9 is made of a doped metallically conductive material, namely of doped titanium nitride in the example here. In the embodiment shown, the gate electrode bulk region 8 is made of polysilicon. As illustrated in the drawing, the gate electrode layer 9 is formed recessed 13, an upper end 12 being arranged at a distance 29 from a frontside 15 of the semiconductor body 20. The numeral 14 indicates the lower end of the gate electrode layer.

The gate region 4 with the gate electrode 6 is arranged in a gate trench 11, which extends down into the drift region 28. Below the gate region 4, a field plate region 41 is formed, which comprises a field electrode 42 and a field dielectric 43. In this example, the field electrode 42 is made of polysilicon.

On the semiconductor body 20, an insulating layer 45 is formed, for instance of silicon oxide or BPSG. On the insulating layer 45, a frontside metallization 46 is arranged, which is connected to the source region 26 and the body region 25 by a vertical interconnect 47. The connections of the gate electrode 6 and of the field electrode 42 are formed outside the drawing plane.

Figure 2:
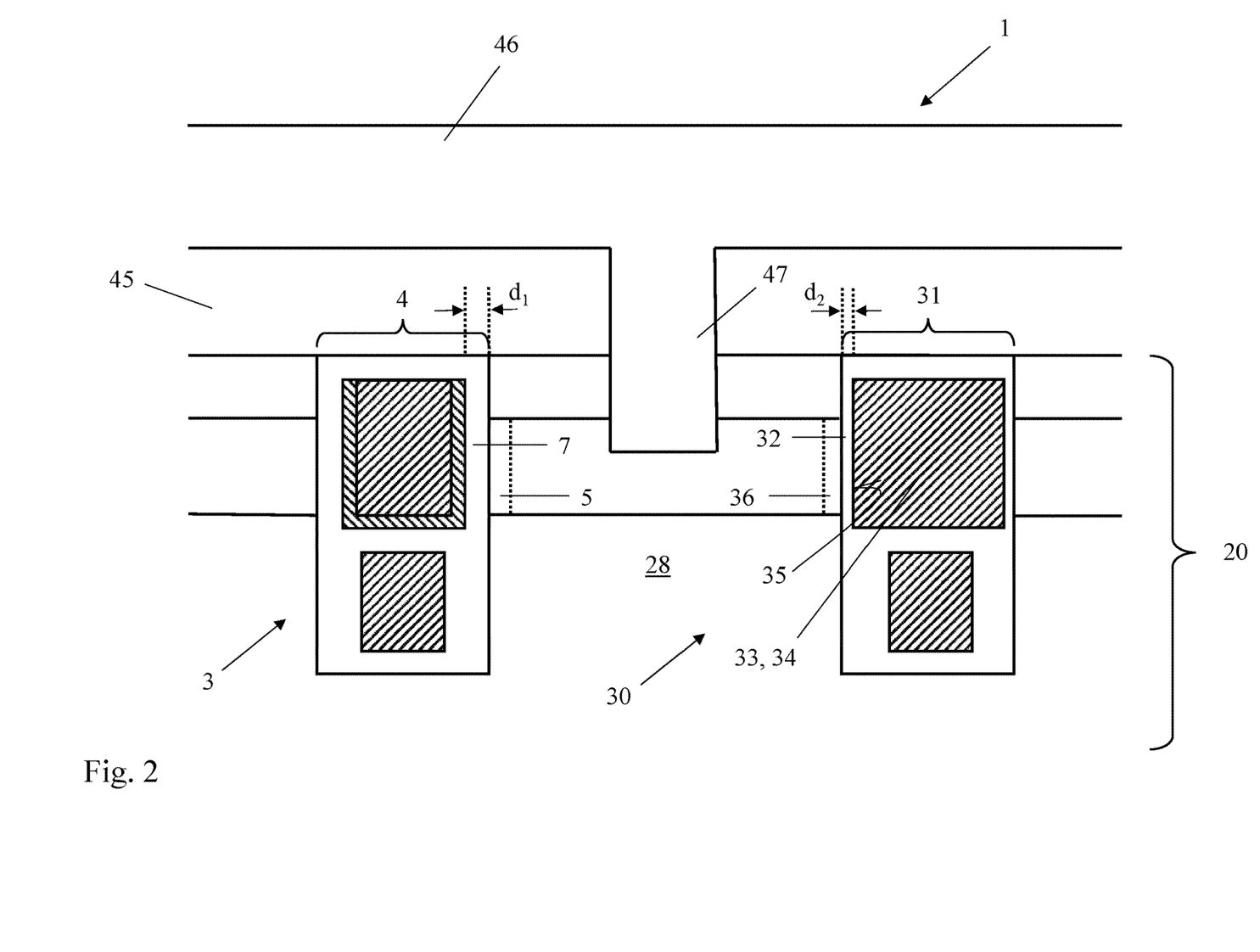
FIG. 2 shows a power device comprising a transistor device and an MGD diode formed in a semiconductor body.

FIG. 2 illustrates the transistor device 3 as shown in FIG. 1, wherein a MOS-gated diode 30 is formed in the semiconductor body 20 in addition. The MOS-gated diode 30 comprises an MGD gate region 31 having an MGD interlayer dielectric 32 and an MGD gate electrode 33. The latter is formed of an MGD gate electrode bulk region 34 lying directly adjacent to the MGD interlayer dielectric 32. In other words, the MGD gate electrode 33 does not comprise an electrode layer. The MGD gate electrode bulk region 34 contacts an inner sidewall 35 of the MGD interlayer dielectric 32, which faces away from the MGD channel region 36. Compared to a thickness $d_1$ of the gate dielectric 7, the MGD interlayer dielectric 32 has a smaller thickness $d_2$.

FIGS. 3a-h illustrate process steps for manufacturing the MOS-gated diode 30 and the transistor device 3, in particular its gate region 4. Prior to the step shown in FIG. 3a, vertical trenches 111 have been etched into the semiconductor body 20, and the field electrode 42 and field dielectric 43 have been formed at the bottom of each vertical trench 111. Above the field electrodes 42, both vertical trenches 111 are filled up completely with an isolating material 50, for instance silicon oxide. On the frontside 15 of the semiconductor body 20 a resist layer 51 is formed, which covers the vertical trench 111 for the transistor 3 and exposes the vertical trench 111 for the MOS-gated diode 30.

Figure 3A:
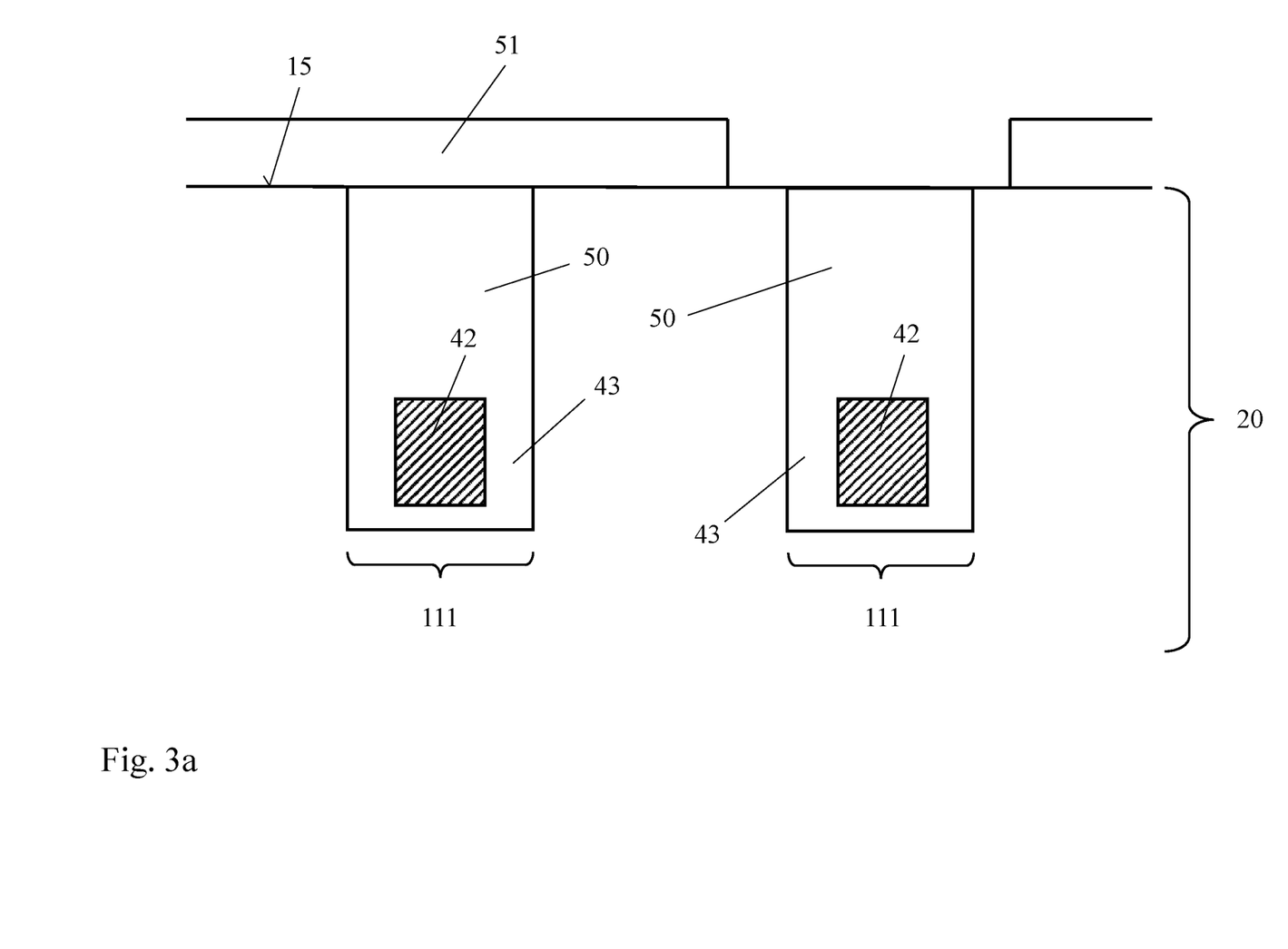
FIGS. 3a-h illustrate several process steps for manufacturing the power device of FIG. 2.
Figure 3B:
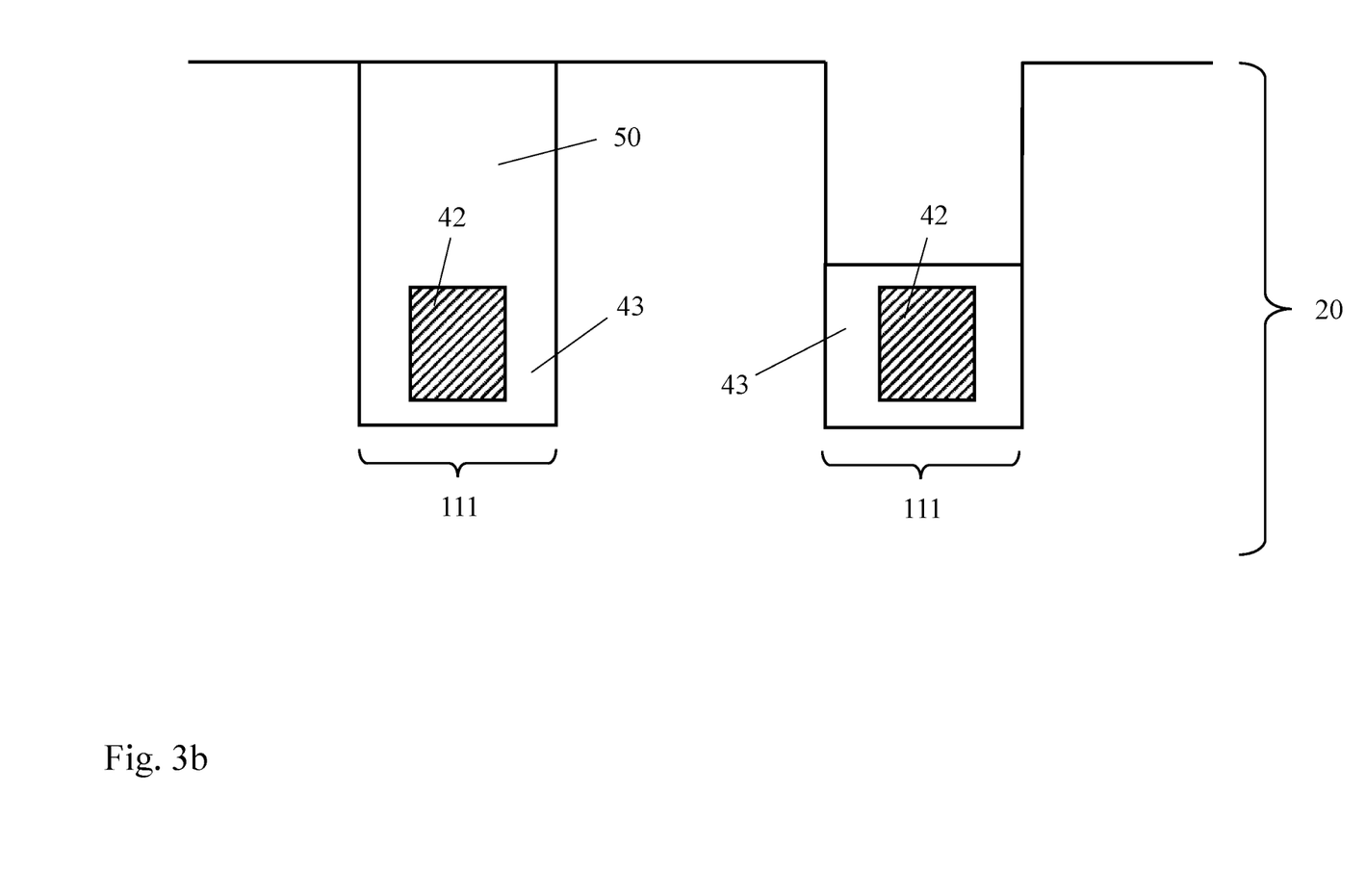
Figure 3C:
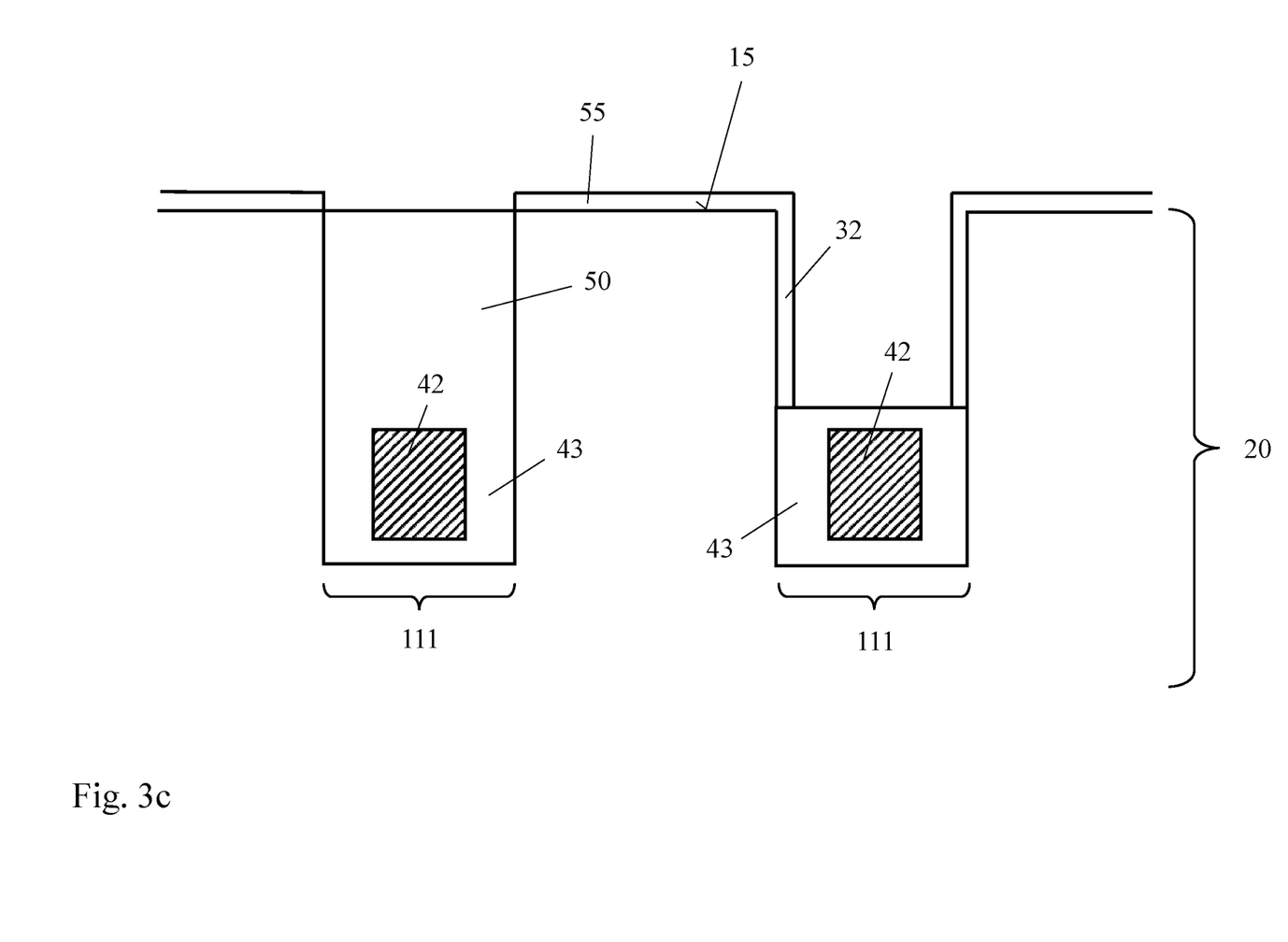
Figure 3D:
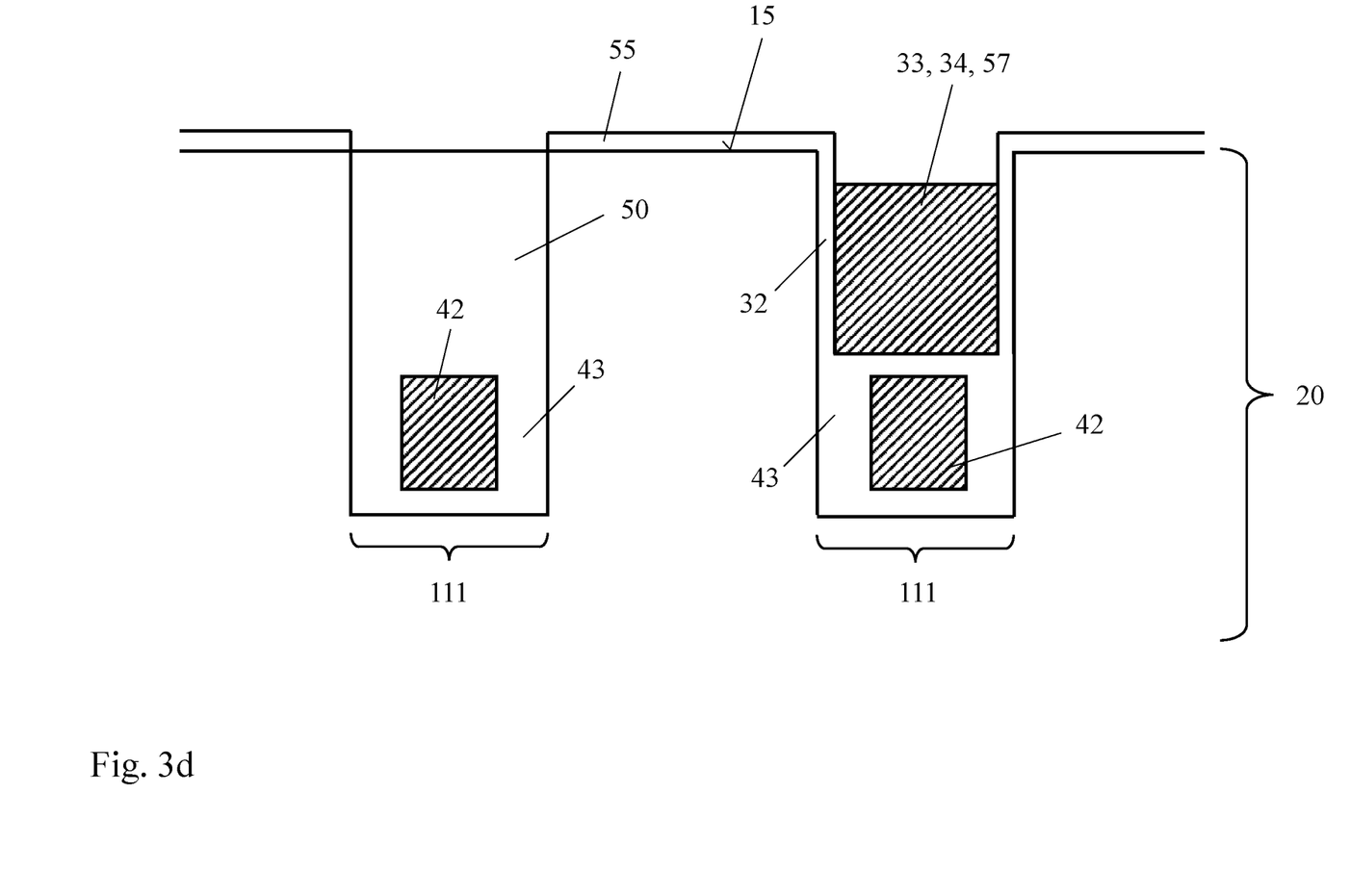

In a subsequent etch step, the isolating material 50 is etched back in the vertical trench 111 for the MOS-gated diode 30. This can for instance be done by wet etching. Subsequently, the resist layer 51 is removed, as shown in FIG. 3b. Thereafter, the MGD interlayer dielectric 32 is formed, e. g. in an oxidation step. This results also in a layer 55 of the dielectric material formed on the frontside 15 of the semiconductor body 20, as illustrated in FIG. 3c. Subsequently, a gate electrode material 57 is deposited in excess, filling the vertical trench 111 and covering the frontside 15 of the semiconductor body (not shown). FIG. 3d illustrates the device after a subsequent etch back step, for instance a plasma recess in case of polysilicon used as gate electrode material 57. Likewise, the MGD gate electrode bulk region 34 is formed, namely the MGD gate electrode 33.

Figure 3E:
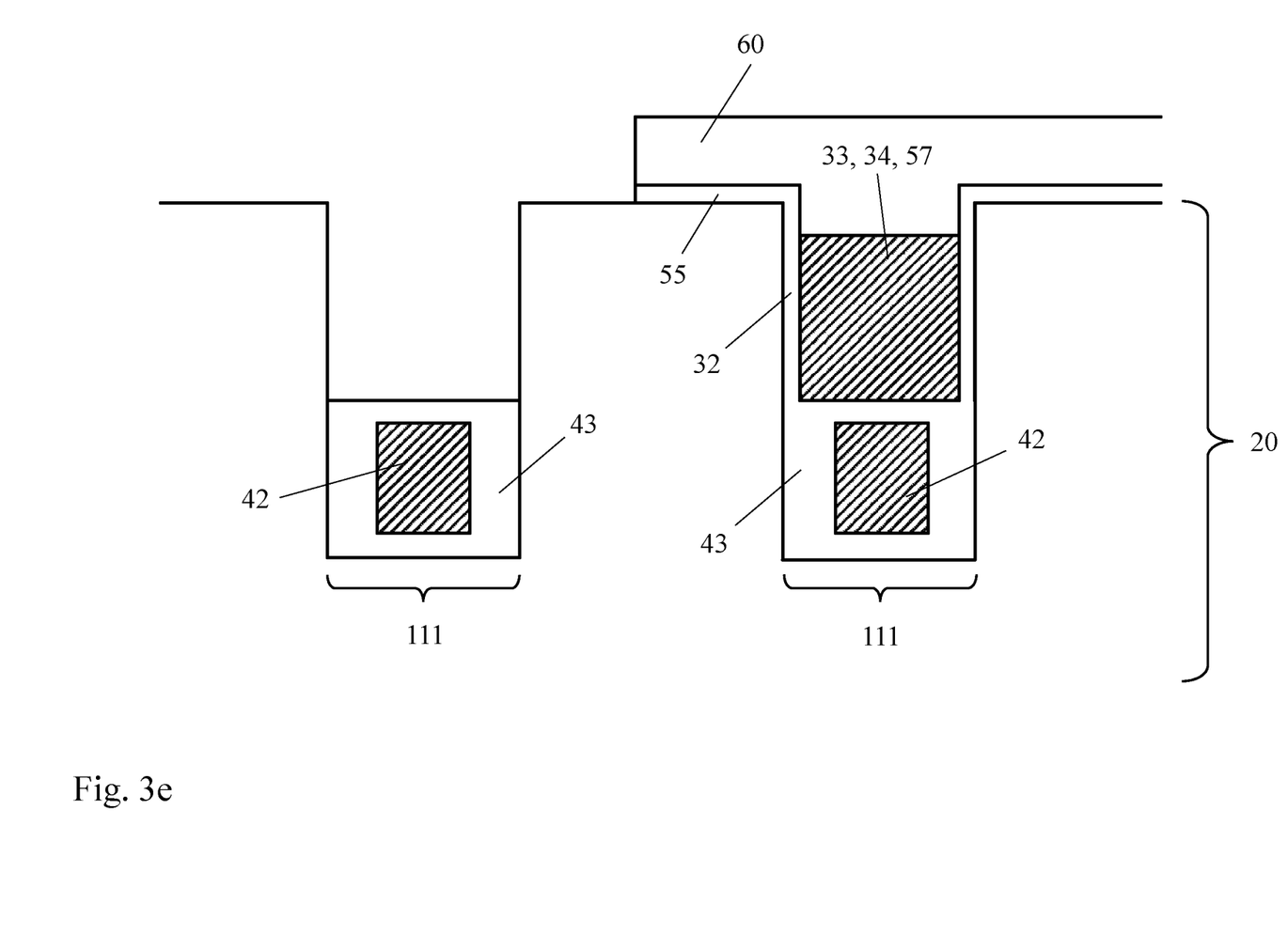

In the process step of FIG. 3e, the vertical trench 111 with the MGD gate electrode 33 is covered by a resist layer 60 which exposes the vertical trench 111 for forming the gate region 4 of the transistor device 3. The isolating material 50 in the trench is etched back, for instance by wet etching. In the exposed area, this can also remove the layer 55 of dielectric material.

Figure 3F:
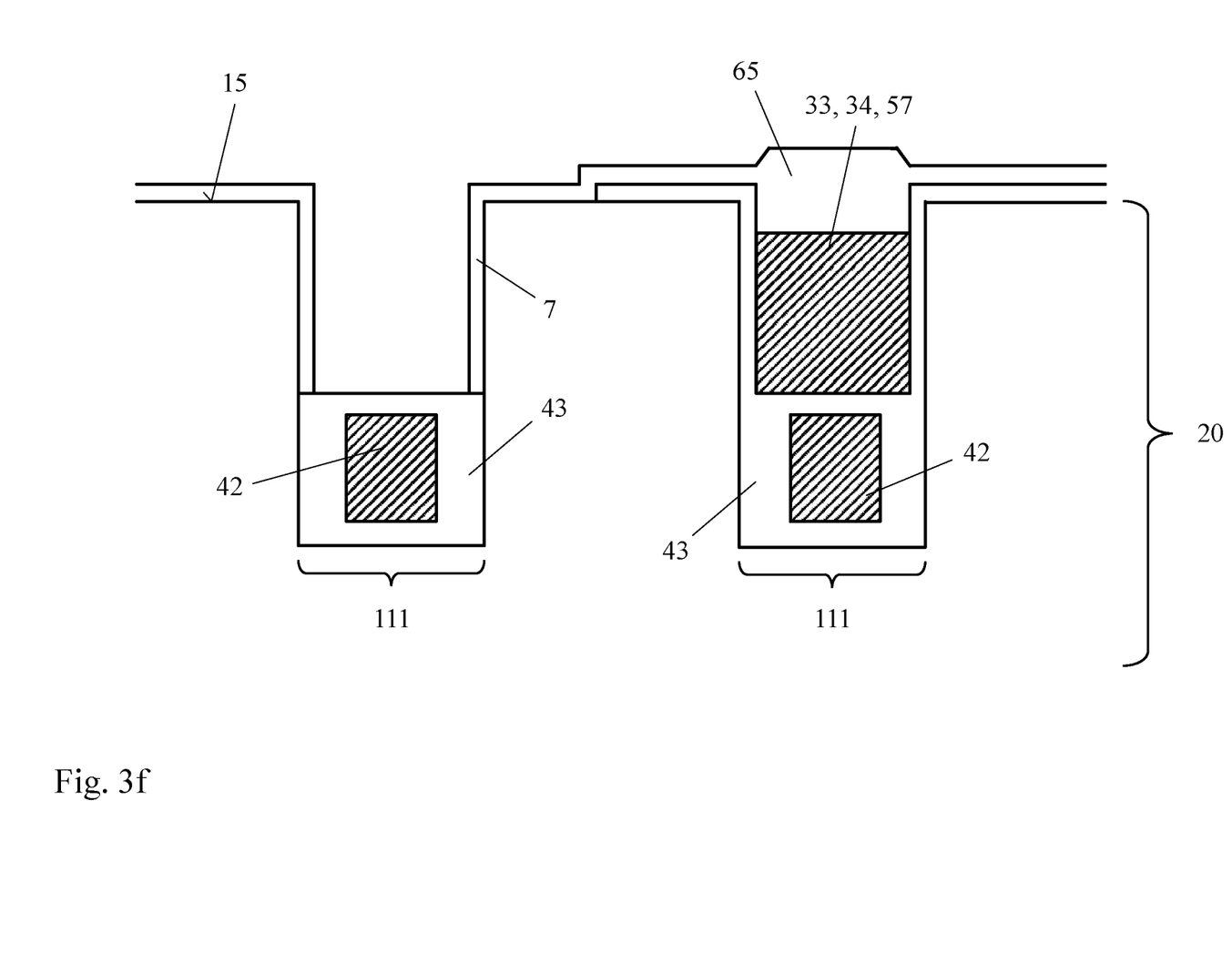

FIG. 3f illustrates the device after a formation of the gate dielectric 7, for instance by oxidation. This can be done at an increased temperature, for instance of around 900° C. As illustrated in FIG. 3f schematically, the gate electrode material of the MGD gate electrode 33 can oxidize as well, resulting for instance in a region 65 of polysilicon oxide above an MGD gate electrode 33 made of polysilicon.

After the formation of the gate dielectric 7, the gate electrode layer 9 is formed by depositing an electrically conductive material 90, for instance titanium nitride. This results also in a layer 70 of the metallically conductive material 90 formed on the frontside 15 of the semiconductor body 20, see FIG. 3g. The gate electrode layer 9 can be doped in-situ during its deposition or in a separate step, see FIG. 4 for illustration. The sidewall 10 of the MGD interlayer dielectric 32 is already covered by the MGD gate electrode 33.

Figure 3G:
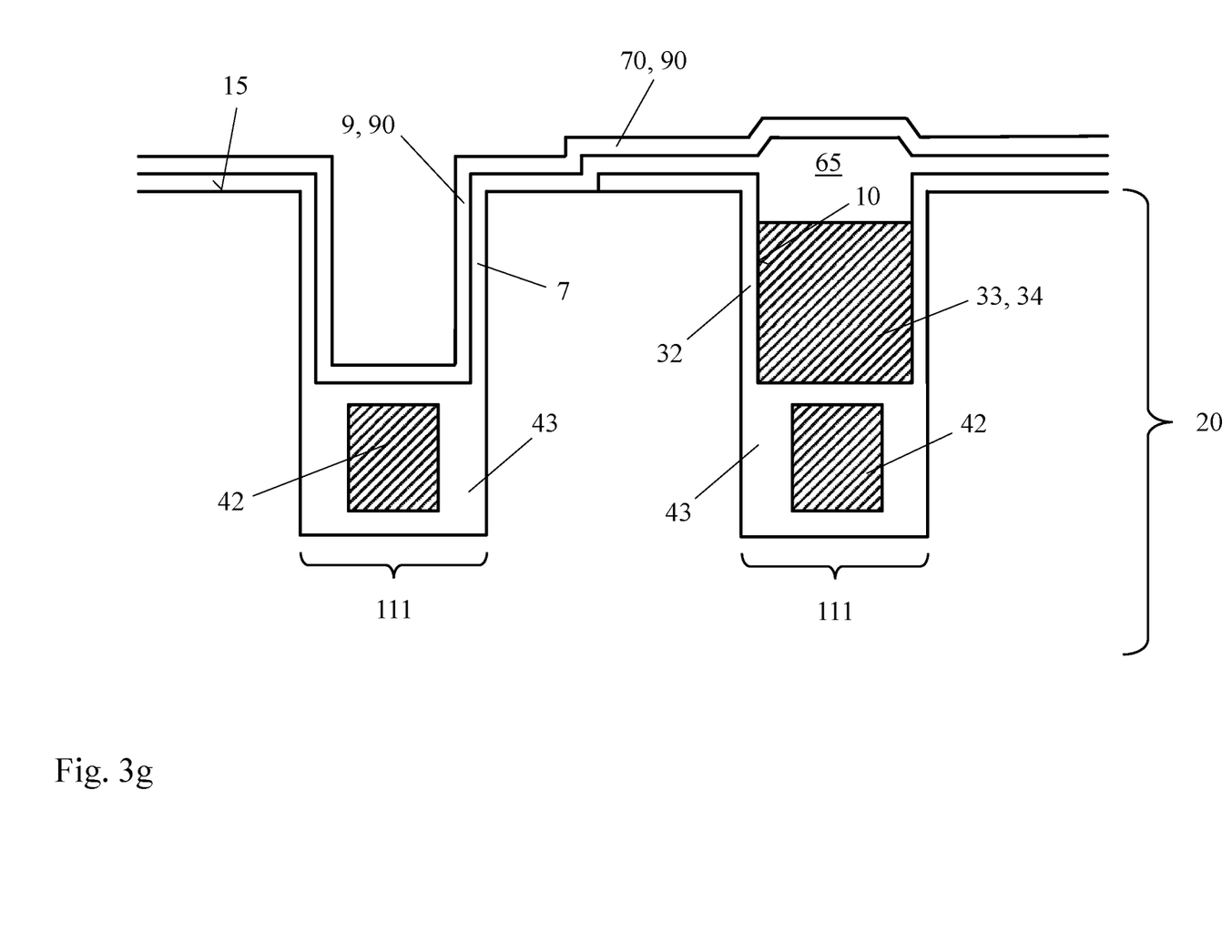
Figure 3H:
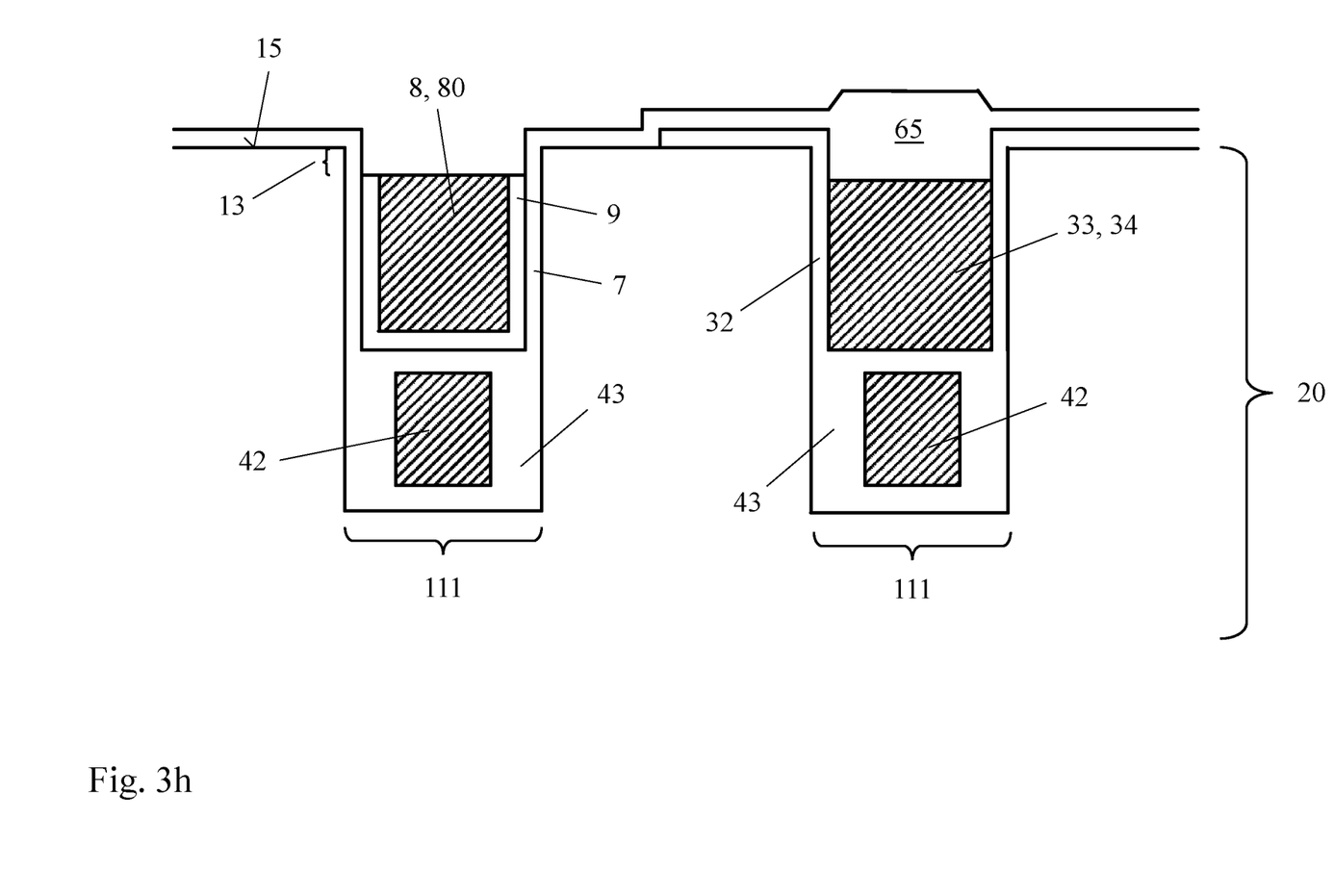

After the formation of the gate electrode layer 9, the gate electrode bulk region 8 is formed, as illustrated in FIG. 3h. For that purpose, the gate electrode bulk material 80 is deposited in excess, covering the frontside 15 of the semiconductor body 20 (not shown). In a subsequent etch back step, the layer 70 of the metallically conductive material 90 arranged on the frontside 15 of the semiconductor body 20 serves as a hard mask and protects the MGD gate electrode 33 formed in the vertical trench 111. In the process step shown in FIG. 3h, the layer 70 has been etched away after the aforementioned etch back step. With the etch step for removing the layer 70, the recess 13 can be adapted (see also FIG. 1).

Figure 4:
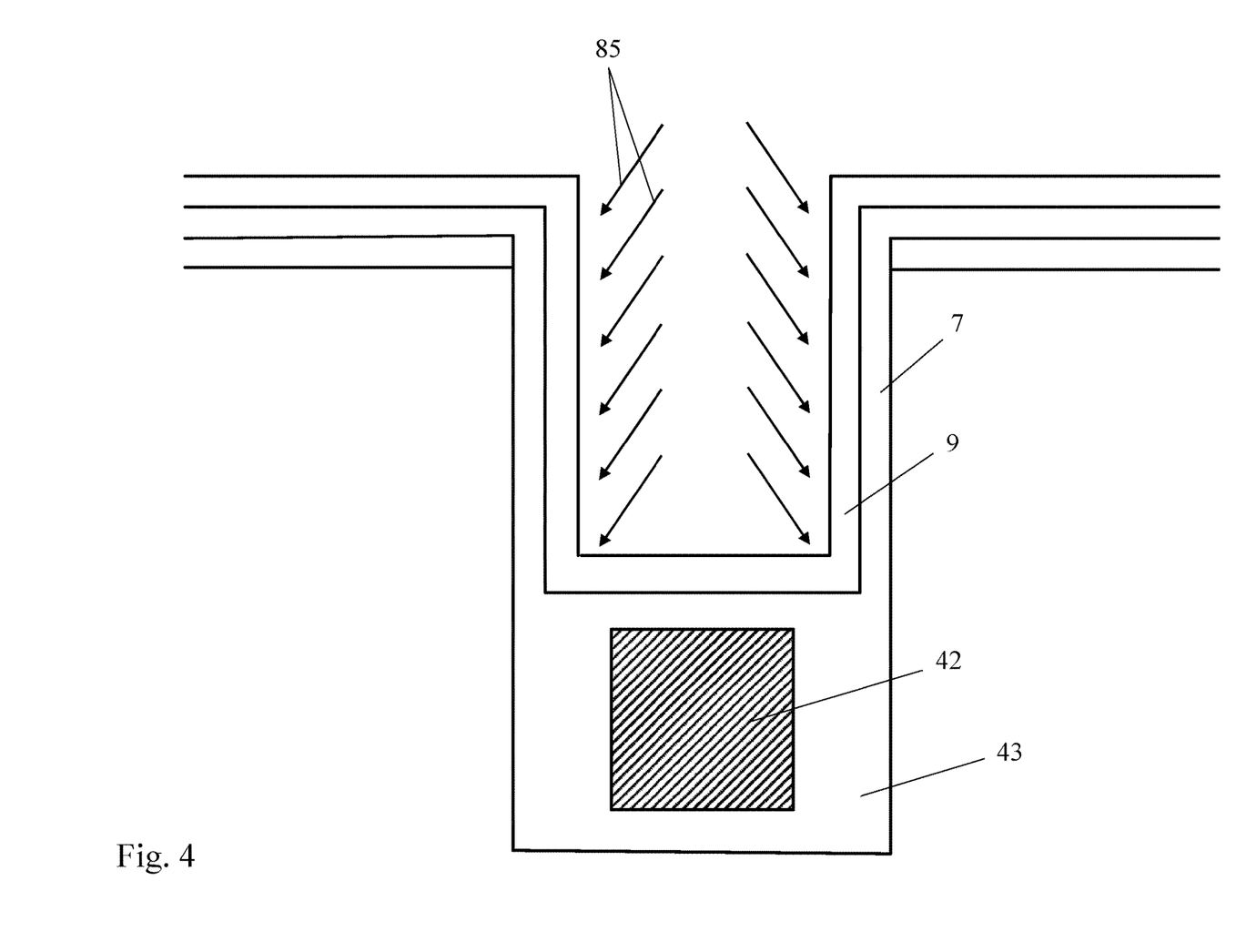
FIG. 4 illustrates a process step of implanting a gate electrode layer in a detailed view.

FIG. 4 illustrates in a detailed view a process step that can be introduced between the steps of FIG. 3g and FIG. 3h, namely a doping of the gate electrode layer 9 by a doping agent 85. As discussed in the general description in detail, this can allow for an adaption of the work function.

Figure 5:
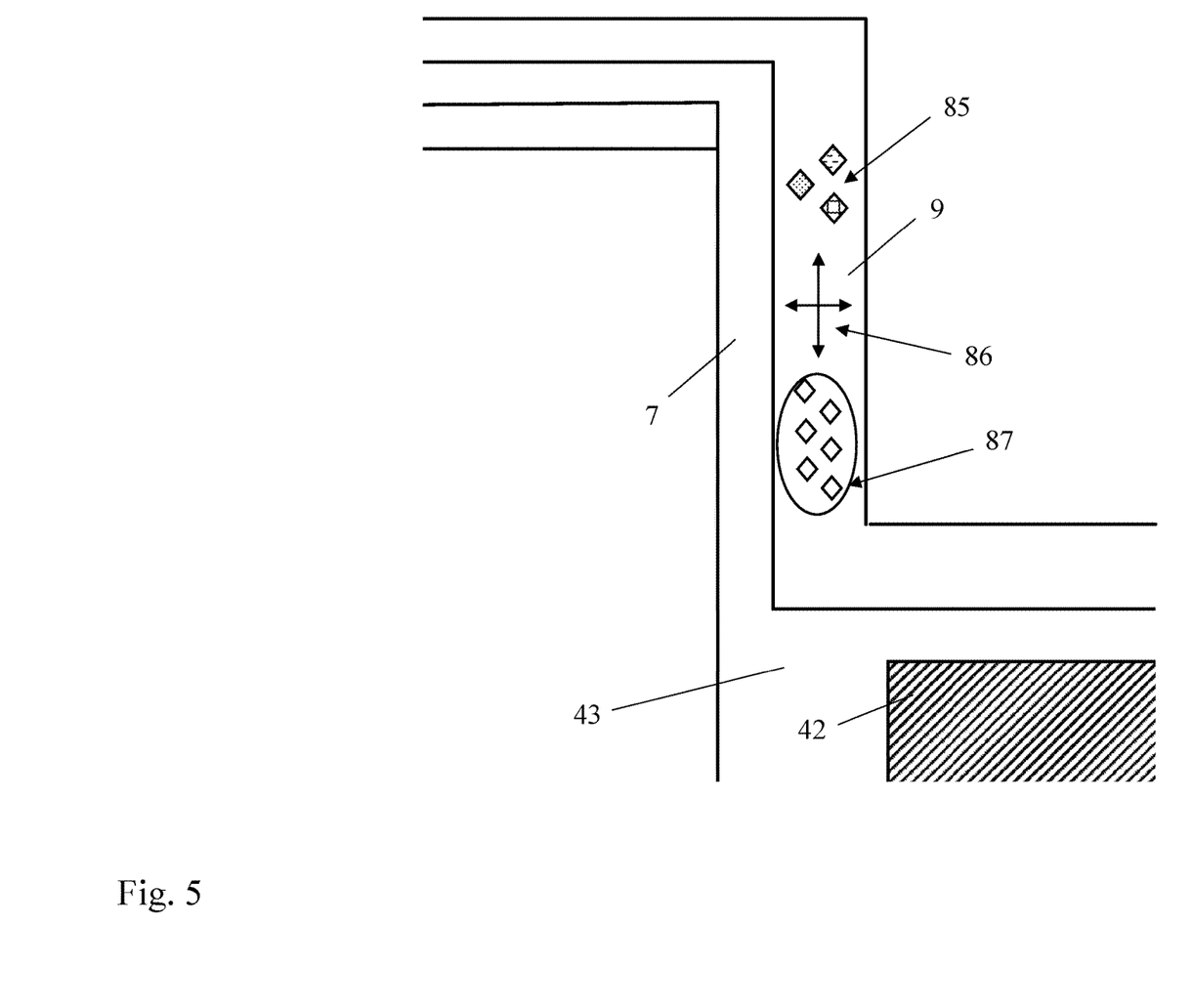
FIG. 5 summarizes in a schematic overview possibilities for adapting the doping of the gate electrode layer.

FIG. 5 summarizes schematically some variables for tuning the work function by doping. In addition to the doping agent 85, namely the species used for doping (e. g. fluorine and/or nitrogen or the like), the position 86 and density 87 of the doping agent 85 can be used for the work function adaption.

Figure 6:
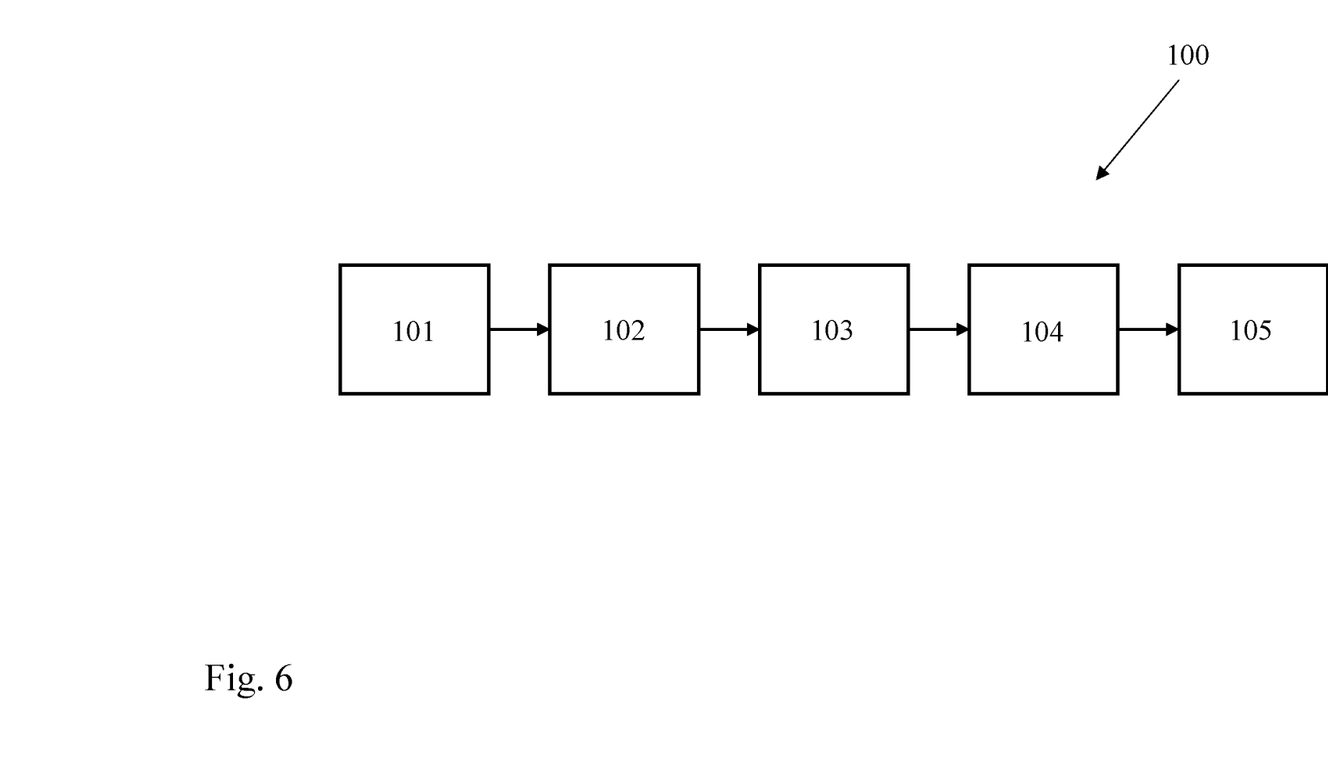
FIG. 6 summarizes some process step in a flow diagram.

FIG. 6 shows a flow diagram 100 summarizing some process steps for manufacturing the device. After forming 101 the MGD interlayer dielectric 32, the MGD gate electrode 33 is formed 102. Subsequently, the gate dielectric 7 of the transistor device 3 is formed 103, the gate electrode layer 9 being formed 104 subsequently. Thereafter, the gate electrode bulk region 8 is formed 105.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor power device, comprising:
   a semiconductor body in which a transistor device is formed;
   a source region of the transistor device at a frontside of the semiconductor body;
   a drain region of the transistor device at a backside of the semiconductor body;
   a gate region of the transistor device; and
   a channel region of the transistor device laterally aside the gate region and vertically between the source region and the drain region,
   wherein in an upper part of the gate region that laterally adjoins both the source region and the channel region, the gate region comprises a gate electrode for controlling a channel formation in the channel region, and a gate dielectric laterally between the channel region and the gate electrode,
   wherein the gate electrode comprises a gate electrode bulk region and a gate electrode layer laterally between the gate dielectric and the gate electrode bulk region,
   wherein the gate electrode layer comprises titanium nitride, titanium, titanium tungsten, tungsten, or cobalt,
   wherein the gate electrode layer is doped with at least one doping agent selected from the group consisting of: fluorine; nitrogen; carbon; aluminum; oxygen; and hydrogen,
   wherein the gate electrode bulk region comprises doped polysilicon.

2. The semiconductor power device of claim 1, wherein the gate electrode layer extends vertically between a lower end and an upper end, and wherein the upper end of the gate electrode layer is arranged recessed with respect to a frontside of the semiconductor body.

3. The semiconductor power device of claim 1, further comprising a MOS-gated diode (MGD) formed in the semiconductor body, wherein an MGD gate region of the MOS-gated diode comprises an MGD interlayer dielectric and an MGD gate electrode, the MGD gate electrode having an MGD gate electrode bulk region formed directly adjacent the MGD interlayer dielectric.

4. The semiconductor power device of claim 3, wherein the gate electrode bulk region of the transistor device and the MGD gate electrode bulk region are made of a same material.

5. The semiconductor power device of claim 1, further comprising an additional transistor device formed in the semiconductor body and which comprises a gate region with a gate electrode and a gate dielectric, the gate electrode of the additional transistor device having a gate electrode bulk region and a gate electrode layer laterally between the gate dielectric and the gate electrode bulk region, and wherein the gate electrode layer of the additional transistor device has different material properties than the gate electrode layer of the transistor device.

6. The semiconductor power device of claim 1, further comprising an additional transistor device formed in the semiconductor body and which comprises a gate region with a gate electrode and a gate dielectric, wherein the gate electrode of the additional transistor device has a gate electrode bulk region formed directly adjacent the gate dielectric.

7. An arrangement, comprising:
a plurality semiconductor power devices each of which comprises a semiconductor body in which a transistor device is formed, the transistor device having a source region at a frontside of the semiconductor body, a drain region at a backside of the semiconductor body, a gate region, and a channel region laterally aside the gate region and vertically between the source region and the drain region, wherein in an upper part of the gate region that laterally adjoins both the source region and the channel region, the gate region comprises a gate electrode for controlling a channel formation in the channel region, and a gate dielectric laterally between the channel region and the gate electrode, the gate electrode comprising a gate electrode bulk region and a gate electrode layer laterally between the gate dielectric and the gate electrode bulk region, the gate electrode layer comprising titanium nitride, titanium, titanium tungsten, tungsten, or cobalt,
wherein the gate electrode bulk region of the plurality semiconductor power devices comprises doped polysilicon,
wherein the gate electrode layer of the plurality semiconductor power devices is doped with at least one doping agent selected from the group consisting of: fluorine; nitrogen; carbon; aluminum; oxygen; and hydrogen.

8. A method for manufacturing a semiconductor power device, the method comprising:
forming a source region of a transistor device in at a frontside of a semiconductor body;
forming a drain region of the transistor device at a backside of the semiconductor body;
forming a gate region of the transistor device; and
forming a channel region of the transistor device laterally aside the gate region and vertically between the source region and the drain region,
wherein forming the gate region comprises forming, in an upper part of the gate region that laterally adjoins both the source region and the channel region, a gate electrode for controlling a channel formation in the channel region and a gate dielectric laterally between the channel region and the gate electrode,
wherein forming the gate electrode comprises forming a gate electrode bulk region and a gate electrode layer laterally between the gate dielectric and the gate electrode bulk region, the gate electrode bulk region comprising doped polysilicon and the gate electrode layer comprising titanium nitride, titanium, titanium tungsten, tungsten, or cobalt,
wherein forming the gate electrode layer comprises doping the gate electrode layer with at least one doping agent selected from the group consisting of: fluorine; nitrogen; carbon; aluminum; oxygen; and hydrogen.

9. The method of claim 8, further comprising:
forming a MOS-gated diode (MGD) in the semiconductor body, wherein an MGD gate region of the MOS-gated diode comprises an MGD interlayer dielectric and an MGD gate electrode, the MGD gate electrode having an MGD gate electrode bulk region formed directly adjacent the MGD interlayer dielectric.

10. The method of claim 9, wherein a sidewall of the MGD interlayer dielectric, which lies laterally opposite to an MGD channel region of the MOS-gated diode, is covered when the gate electrode layer of the transistor device is being formed.

11. The method of claim 9, wherein when the gate electrode layer of the transistor device is being formed, the MGD interlayer dielectric is covered by the MGD gate electrode.

12. The method of claim 9, wherein when the titanium nitride, titanium, titanium tungsten, tungsten, or cobalt is deposited for forming the gate electrode layer of the transistor device, a layer of the titanium nitride, titanium, titanium tungsten, tungsten, or cobalt is simultaneously formed, covering the MGD gate electrode, and wherein the layer of the titanium nitride, titanium, titanium tungsten, tungsten, or cobalt protects the MGD gate electrode during a recess etch of the gate electrode bulk material.

* * * * *

UNITED STATES PATENT AND TRADEMARK OFFICE
CERTIFICATE OF CORRECTION

PATENT NO. : 12,439,674 B2
APPLICATION NO. : 17/592543
DATED : October 7, 2025
INVENTOR(S) : J. Bhandari et al.

Page 1 of 1

It is certified that error appears in the above-identified patent and that said Letters Patent is hereby corrected as shown below:

In the Claims

Column 9, Line 17 (Claim 7, Line 2), please change "plurality" to -- plurality of --.
Column 9, Line 35 (Claim 7, Line 20), please change "plurality" to -- plurality of --.
Column 9, Line 38 (Claim 7, Line 23), please change "plurality" to -- plurality of --.

Signed and Sealed this
Twenty-fifth Day of November, 2025

John A. Squires
*Director of the United States Patent and Trademark Office*